(12) United States Patent
Rothkopf et al.

(10) Patent No.: US 11,304,316 B2
(45) Date of Patent: *Apr. 12, 2022

(54) FLEXIBLE DISPLAY DEVICES

(71) Applicant: Apple Inc., Cupertino, CA (US)

(72) Inventors: Fletcher R. Rothkopf, Los Altos, CA (US); Andrew J. M. Janis, Toronto (CA); Teodor Dabov, Los Angeles, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/905,817

(22) Filed: Jun. 18, 2020

(65) Prior Publication Data
US 2020/0323089 A1 Oct. 8, 2020

Related U.S. Application Data

(60) Continuation of application No. 16/159,253, filed on Oct. 12, 2018, now Pat. No. 10,694,624, which is a continuation of application No. 15/270,936, filed on Sep. 20, 2016, now Pat. No. 10,104,787, which is a continuation of application No. 14/335,783, filed on
(Continued)

(51) Int. Cl.
*G06F 1/16* (2006.01)
*H05K 5/00* (2006.01)
*H04M 1/02* (2006.01)
*H05K 5/02* (2006.01)

(52) U.S. Cl.
CPC ......... *H05K 5/0017* (2013.01); *G06F 1/1652* (2013.01); *G06F 1/1681* (2013.01); *H04M 1/0216* (2013.01); *H04M 1/0268* (2013.01); *H05K 5/0217* (2013.01); *H05K 5/0226* (2013.01); *H04M 1/022* (2013.01)

(58) Field of Classification Search
CPC .... G06F 1/1652; G06F 1/1616; G06F 1/1637; G06F 1/1641
See application file for complete search history.

(56) References Cited

U.S. PATENT DOCUMENTS

| 4,066,855 A | 1/1978 | Zenk |
| 4,085,302 A | 4/1978 | Zenk et al. |

(Continued)

*Primary Examiner* — Anthony Q Edwards
(74) *Attorney, Agent, or Firm* — Treyz Law Group, P.C.; G. Victor Treyz; Kendall P. Woodruff

(57) ABSTRACT

Electronic devices may be provided that contain multiple housing portions. The housing portions may be coupled together using hinges. The hinges may include hinges based on a three-bar linkage, hinges based on a four-bar linkage, hinges with slotted members, hinges formed from flexible support structures, and hinges based on flexible housing structures. Flexible displays may be mounted to the housing portions overlapping the hinges. When the housing portions in a device are rotated relative to each other, the flexible display may bend. The hinge may be configured to allow the flexible display to be placed in a front-to-front configuration in which an active side of the display faces itself or a back-to-back configuration. Engagement structures may be used to help the housing grip external objects and to hold the housing portions together. The hinges may be provided with rotational detents to help hold the flexible display in desired positions.

18 Claims, 18 Drawing Sheets

Related U.S. Application Data

Jul. 18, 2014, now Pat. No. 9,504,170, which is a division of application No. 13/177,165, filed on Jul. 6, 2011, now Pat. No. 8,787,016.

(56) References Cited

U.S. PATENT DOCUMENTS

| | | | |
|---|---|---|---|
| 4,986,763 A * | 1/1991 | Boyle | G06F 1/1616 361/679.26 |
| 5,432,676 A * | 7/1995 | Satoh | G06F 1/1616 16/223 |
| 5,483,261 A | 1/1996 | Yasutake | |
| 5,488,204 A | 1/1996 | Mead et al. | |
| 5,825,352 A | 10/1998 | Bisset et al. | |
| 5,835,079 A | 11/1998 | Shieh | |
| 5,880,411 A | 3/1999 | Gillespie et al. | |
| 5,898,600 A | 4/1999 | Isashi | |
| 6,107,988 A | 8/2000 | Phillipps | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,421,235 B2 | 7/2002 | Ditzik | |
| 6,510,325 B1 | 1/2003 | Gawins et al. | |
| 6,577,496 B1 | 6/2003 | Gioscia et al. | |
| 6,690,387 B2 | 2/2004 | Zimmerman et al. | |
| 6,697,045 B2 | 2/2004 | Min | |
| 6,803,245 B2 | 10/2004 | Auch et al. | |
| 7,015,894 B2 | 3/2006 | Morohoshi et al. | |
| 7,032,984 B2 | 4/2006 | Kim et al. | |
| 7,034,913 B2 | 4/2006 | Ishida | |
| 7,127,776 B2 | 10/2006 | Park | |
| 7,184,064 B2 | 2/2007 | Zimmerman et al. | |
| 7,345,872 B2 * | 3/2008 | Wang | G06F 1/1618 16/354 |
| D580,432 S * | 11/2008 | Yun | D14/345 |
| 7,446,757 B2 | 11/2008 | Mochizuki et al. | |
| 7,483,723 B2 | 1/2009 | Soderlund | |
| 7,515,406 B2 * | 4/2009 | Kee | G06F 1/1616 345/1.1 |
| 7,541,671 B2 | 6/2009 | Foust et al. | |
| 7,565,720 B1 | 7/2009 | Ligtenberg et al. | |
| 7,663,607 B2 | 2/2010 | Hotelling et al. | |
| 7,714,801 B2 | 5/2010 | Kimmel | |
| 7,834,451 B2 | 11/2010 | Lee et al. | |
| 8,170,631 B2 | 5/2012 | Aoki et al. | |
| 8,183,459 B2 | 5/2012 | Wei et al. | |
| 8,228,667 B2 * | 7/2012 | Ma | G06F 1/1652 361/679.01 |
| 8,243,459 B2 * | 8/2012 | Hoshino | G06F 1/1647 361/755 |
| 8,380,327 B2 * | 2/2013 | Park | G05B 11/01 700/1 |
| 8,405,978 B2 | 3/2013 | Okutsu | |
| 8,527,892 B2 | 9/2013 | Sirpal et al. | |
| 8,723,824 B2 | 5/2014 | Myers et al. | |
| 8,724,304 B2 | 5/2014 | Raff et al. | |
| 8,804,347 B2 | 8/2014 | Martisauskas | |
| 8,816,977 B2 | 8/2014 | Rothkopf et al. | |
| 8,873,225 B2 | 10/2014 | Huitema et al. | |
| 8,929,085 B2 | 1/2015 | Franklin et al. | |
| 8,934,228 B2 | 1/2015 | Franklin et al. | |
| 8,947,627 B2 | 2/2015 | Rappoport et al. | |
| 9,098,242 B2 | 8/2015 | Rappoport et al. | |
| 9,178,970 B2 | 11/2015 | Lynch | |
| 9,400,576 B2 | 7/2016 | Chen et al. | |
| 10,043,421 B2 | 8/2018 | Koo et al. | |
| 10,104,787 B2 * | 10/2018 | Rothkopf | G06F 1/1652 |

| | | | |
|---|---|---|---|
| 2002/0067339 A1 * | 6/2002 | Min | G06F 1/1601 345/156 |
| 2006/0026521 A1 | 2/2006 | Hotelling et al. | |
| 2006/0029218 A1 | 2/2006 | Lu et al. | |
| 2006/0034042 A1 | 2/2006 | Hisano et al. | |
| 2006/0034601 A1 | 2/2006 | Andersson et al. | |
| 2006/0046792 A1 * | 3/2006 | Hassemer | H04M 1/0237 455/575.1 |
| 2006/0050169 A1 | 3/2006 | Misawa | |
| 2006/0107566 A1 | 5/2006 | Van Rens | |
| 2006/0146488 A1 | 7/2006 | Kimmel | |
| 2006/0197753 A1 | 9/2006 | Hotelling | |
| 2007/0097014 A1 * | 5/2007 | Solomon | G06F 1/1662 345/1.1 |
| 2007/0117600 A1 | 5/2007 | Robertson et al. | |
| 2007/0268264 A1 | 11/2007 | Aarras et al. | |
| 2008/0062625 A1 * | 3/2008 | Batio | G06F 1/1615 361/679.29 |
| 2008/0125195 A1 * | 5/2008 | Maenpaa | H04M 1/0216 455/575.3 |
| 2008/0158795 A1 | 7/2008 | Aoki et al. | |
| 2009/0103261 A1 * | 4/2009 | Shih | G06F 1/1616 361/679.58 |
| 2009/0137171 A1 | 5/2009 | Waeber et al. | |
| 2009/0256471 A1 | 10/2009 | Kim et al. | |
| 2010/0026952 A1 | 2/2010 | Miura et al. | |
| 2010/0079355 A1 * | 4/2010 | Kilpatrick, II | G06F 1/1649 345/1.3 |
| 2010/0201604 A1 | 8/2010 | Kee et al. | |
| 2010/0207844 A1 | 8/2010 | Manning | |
| 2010/0227650 A1 | 9/2010 | Kim et al. | |
| 2010/0246103 A1 | 9/2010 | Visser et al. | |
| 2010/0315399 A1 | 12/2010 | Jacobson et al. | |
| 2011/0007042 A1 * | 1/2011 | Miyaguchi | G02F 1/13454 345/204 |
| 2011/0063809 A1 * | 3/2011 | Hoshino | G06F 1/1647 361/752 |
| 2011/0086680 A1 | 4/2011 | Kim et al. | |
| 2011/0210937 A1 | 9/2011 | Kee et al. | |
| 2011/0241998 A1 | 10/2011 | McKinney et al. | |
| 2012/0002360 A1 | 1/2012 | Seo et al. | |
| 2012/0044620 A1 | 2/2012 | Song et al. | |
| 2012/0110784 A1 * | 5/2012 | Hsu | G06F 1/1681 16/226 |
| 2012/0120618 A1 | 5/2012 | Bohn | |
| 2012/0127087 A1 | 5/2012 | Ma | |
| 2012/0188703 A1 | 7/2012 | Yang et al. | |
| 2012/0218219 A1 | 8/2012 | Rappoport et al. | |
| 2012/0227217 A1 | 9/2012 | Chen | |
| 2012/0236484 A1 * | 9/2012 | Miyake | G06F 1/1616 361/679.01 |
| 2012/0242588 A1 | 9/2012 | Myers et al. | |
| 2012/0262870 A1 | 10/2012 | Leung | |
| 2012/0264489 A1 | 10/2012 | Choi et al. | |
| 2012/0307423 A1 | 12/2012 | Bohn et al. | |
| 2012/0314399 A1 * | 12/2012 | Bohn | G06F 1/1652 362/97.1 |
| 2013/0037228 A1 | 2/2013 | Verschoor et al. | |
| 2013/0081756 A1 | 4/2013 | Franklin et al. | |
| 2013/0082984 A1 | 4/2013 | Drzaic et al. | |
| 2013/0083496 A1 | 4/2013 | Franklin et al. | |
| 2013/0140965 A1 | 6/2013 | Franklin et al. | |
| 2013/0180882 A1 | 7/2013 | Hamers et al. | |
| 2014/0104765 A1 | 4/2014 | Hoshino | |
| 2014/0226275 A1 * | 8/2014 | Ko | G06F 1/1681 361/679.27 |
| 2014/0375660 A1 * | 12/2014 | Tamaki | G06F 3/0446 345/522 |
| 2015/0085433 A1 | 3/2015 | Kim | |

* cited by examiner

FLEXIBLE DISPLAY DEVICES

This application is a continuation of U.S. patent application Ser. No. 16/159,253, filed Oct. 12, 2018, which is a continuation of U.S. patent application Ser. No. 15/270,936, filed Sep. 20, 2016, now U.S. Pat. No. 10,104,787, which is a continuation of U.S. patent application Ser. No. 14/335,783, filed Jul. 18, 2014, now U.S. Pat. No. 9,504,170, which is a divisional of U.S. patent application Ser. No. 13/177,165, filed Jul. 6, 2011, now U.S. Pat. No. 8,787,016, all of which are hereby incorporated by reference herein in their entireties.

BACKGROUND

This relates generally to electronic devices, and, more particularly, to electronic devices with flexible displays.

Electronic devices such as cellular telephones, media players, and computers are often provided with displays. For example, electronic devices may be provided with liquid crystal displays. Liquid crystal displays are often mounted under a rigid layer of cover glass. The cover glass protects the liquid crystal display from damage, but the rigid nature of the cover glass and other display layers render the display inflexible.

Flexible display technologies are available that allow displays to be bent. For example, flexible displays may be formed using flexible organic light-emitting diode (OLED) display technology.

It would be desirable to be able to use flexible display technology to provide improved electronic devices.

SUMMARY

Electronic devices may be provided that contain multiple housing portions. The housing portions may include, for example, first and second rectangular housing portions.

The housing portions may be coupled together using hinges. The hinges may include hinges based on a three-bar linkage, hinges based on a four-bar linkage, hinges with slotted members, hinges formed from flexible support structures, and hinges based on flexible housing structures. Flexible displays may be mounted to the housing portions overlapping the hinges. When the housing portions in a device are rotated relative to each other, the flexible display may bend. Hinges may be configured to allow the flexible display to be placed in a front-to-front configuration in which the active side of the display faces itself or a back-to-back configuration in which the active portions of the display face away from each other. To avoid stretching the display, the display may be tensioned with tensioning structures and dispensed from a roller or an opening in a housing structure.

Engagement structures may be used to help the housing grip external objects and to hold the housing portions in desired positions. The hinges may also be provided with rotational detents to help hold the flexible display in desired positions.

Further features of the invention, its nature and various advantages will be more apparent from the accompanying drawings and the following detailed description of the preferred embodiments.

DETAILED DESCRIPTION

Figure 1:
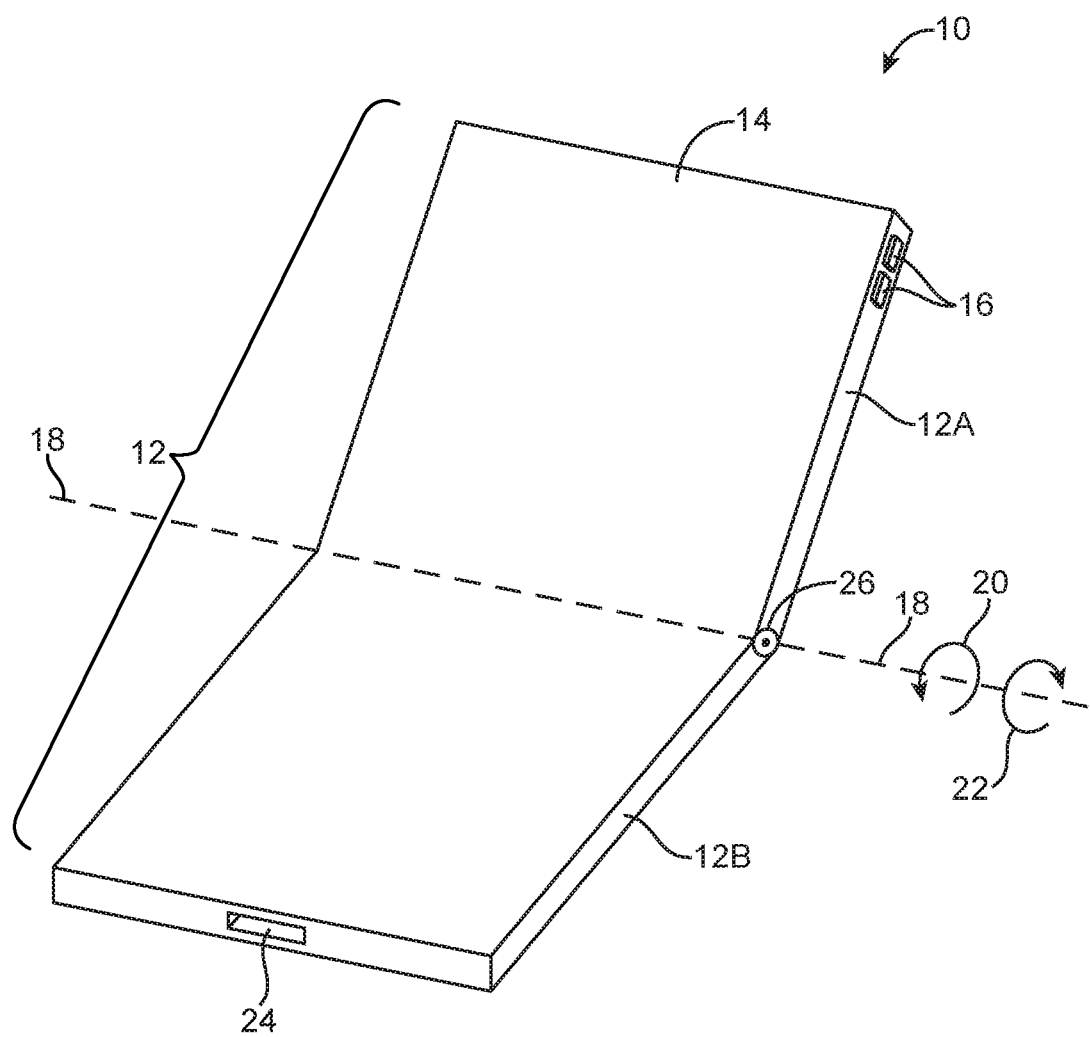
FIG. 1 is a perspective view of an illustrative electronic device with a flexible display in accordance with an embodiment of the present invention.

An illustrative electronic device with a flexible display is shown in FIG. 1. Electronic device 10 may be a portable electronic device or other suitable electronic device. For example, electronic device 10 may be a laptop computer, a tablet computer, a somewhat smaller device such as a wrist-watch device, pendant device, headphone device, earpiece device, or other wearable or miniature device, a cellular telephone, a media player, larger devices such as desktop computers, computers integrated into computer monitors, televisions, set-top boxes or other electronic devices.

Electronic device 10 may have a flexible display such as flexible display 14. Flexible displays such as flexible display 14 may be based on electronic ink displays, organic light-emitting diode displays, or other suitable flexible displays. Arrangements in which the flexible displays in the electronic devices are formed from organic light-emitting diode displays are sometimes described herein as an example. This is, however, merely illustrative. Flexible display 14 may be provided using other display technologies if desired.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. Housing 12 may be provided with features such as buttons 16, speaker ports, microphone ports, connector ports such as illustrative connector port 24, ports or other structures for accommodating sensors and antennas, or other device features.

Device 10 may include one or more displays. The displays may include one or more flexible displays such as display 14 and may include optional rigid displays (e.g., displays mounted under rigid cover glass layers and/or displays with rigid layers of display components).

Displays such as flexible display 14 of device 10 in FIG. 1 may be bent by moving portions of housing 12 with respect to each other. Housing 12 may, in general, have two or more parts that may be moved with respect to each other while bending a portion of flexible display 14. In the example of FIG. 1, housing 12 has upper portion 12A and lower portion 12B. Housing portions 12A and 12B may be coupled to each other using hinge 26, so that the relative positions of portions 12A and 12B may be adjusted by rotation of portions 12A and 12B with respect to each other. If desired, three or more pieces of housing 12 may be coupled together using hinges. Coupling mechanisms other than hinges that allow portions 12A and 12B and optional additional housing portions to move with respect to each other may also be used. The FIG. 1 arrangement in which device 10 has two housing portions that are connected using hinge structures is merely illustrative.

Hinge 26 may allow housing portion 12A to rotate relative to housing portion 12B about axis 18. Hinge 26 may, for example, allow portion 12A to rotate in direction 20 or direction 22. When rotated in direction 20, housing portion 12A may close on top of portion 12B to enclose and protect display 14. Display 14 may bend along axis 18, so axis 18 may sometimes be referred to as a bend axis, flex axis, hinge axis, or rotational axis.

Figure 2:
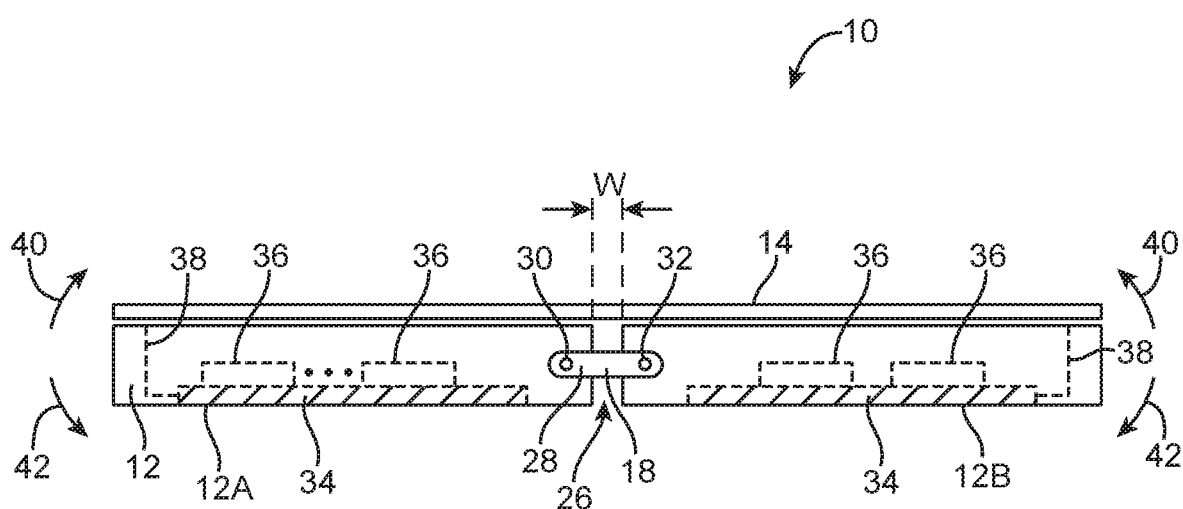
FIG. 2 is a side view of an illustrative electronic device with a flexible display and a hinge formed using a three-bar linkage arrangement in which the flexible display has been placed in a planar configuration in accordance with an embodiment of the present invention.

Hinge 26 may allow housing portions 12A and 12B to be flattened into a planar device configuration of the type shown in FIG. 2. As shown in the side view of FIG. 2, device 10 may be placed into a configuration in which display 14 is substantially planar. In this type of arrangement, display 14 is not bent in the vicinity of hinge 26, but rather is maintained in a flat configuration in which display 14 and its outermost surface are planar. This type of position may be desirable when a user of device 10 is viewing a video, text, or graphics over all of display 14 (i.e., over all of a display surface that spans housing portions 12A and 12B).

Device 10 may include internal components 36. Components 36 may include electrical components such as display driver circuitry, one or more batteries, sensors, microphones, speakers, integrated circuits, microprocessors, power management units, radio-frequency transceiver circuitry, baseband processor circuitry, discrete components such as capacitors, resistors, and inductors, switches, vibrators, connectors, printed circuit boards, wires, transmission lines, and other electrical devices. Components 36 may be mounted on one or more substrates such as substrates 34. Substrates 34 may include rigid printed circuit boards (e.g., boards formed from fiberglass-filled epoxy such as FR4 printed circuit boards on which patterned metal traces have been formed), flexible printed circuit boards (e.g., "flex circuits" formed form sheets of polymer such as polyimide on which patterned conductive traces have been formed), rigid flex (e.g., boards with both rigid portions and flex circuit tails), plastic carriers, or other substrates. Interconnect paths such as paths 38 may be used to interconnect components 36 with each other and with components such as display 14. Interconnect paths 38 may include flex circuits (e.g., traces on flex circuits that form signal paths), wires, cables, traces on rigid printed circuit boards and other substrates, or other suitable conductive paths. Using interconnect paths 38, signals may be routed between respective components 36 and signals may be routed from between components 36 and display 14. For example, signals from a display driver integrated circuit may be routed to display pixels and traces in display 14.

Hinge 26 may be based on a flexible material (e.g., a sheet of flexible polymer or metal), may be based on a single-shaft mechanism, may be based on a two-shaft mechanism, may be based on a three-shaft mechanism, or may use four or more shafts (i.e., pins or other structures that support rotational motion about a rotational axis) for allowing housing members 12A and 12B to move relative to one another. In the example of FIG. 2, hinge 26 has a central member 28 that has two associated shafts. Shaft 30 is attached between hinge member 28 and housing portion 12A. Hinge member 28 is attached to housing portion 12B by shaft 32. The structures for forming shafts such as shafts 30 and 32 may be formed from pins, cylindrical rods, or other suitable rotational axis mechanisms for supporting rotational motion about a rotational axis. Hinge 26 may be made up of structures on side of device 10, structures on both sides of device 10 (e.g., on the opposing ends of hinge axis 18), or in more than two locations along axis 18.

Because there are three movable parts in this type of hinge mechanism (i.e., housing 12A, member 28, and housing 12B), hinge arrangements of the type shown in FIG. 2 are sometimes referred to as three-bar linkages. Hinge 26 may, in general, be implemented using a two-bar linkage, a three-bar linkage, a four-bar linkage, or a linkage involving more than four bars. Combinations of these linkages may also be used in forming flexible connecting structures between separate housing portions such as housing portions 12A and 12B (and, if desired, one or more additional housing portions).

As shown in FIG. 2, portions 12A and 12B of housing 12 may be separated by a gap such as gap W. Gap W and the mechanism used for hinge 28 (e.g., a three-bar linkage) may provide sufficient flexibility to allow portions 12A and 12B to be folded together by moving portions 12A and 12B in directions 40 and may provide sufficient flexibility to allow portions 12A and 12B to be placed in a back-to-back arrangement by moving portions 12A and 12B in directions 42.

When portions 12A and 12B are folded together, the outer surface of the portion of display 14 that is supported by housing portion 12A faces the outer surface of the portion of display 14 that is supported by housing portion 12B. The outer surface of display 14 is therefore protected from undesired contact, as shown in the folded arrangement of FIG. 3. When folded into the configuration of FIG. 3, bent portion 44 of display 14 may be exhibit a bend radius of about 1 mm (e.g., 4 mm or less, 3 mm or less, 2 mm or less, 1 mm or less, or 0.5 mm or less, as examples). Configurations of the type shown in FIG. 3 are sometimes referred to as face-to-face configurations, because active surface portions of display 14 are face to face with each other.

Figure 4:
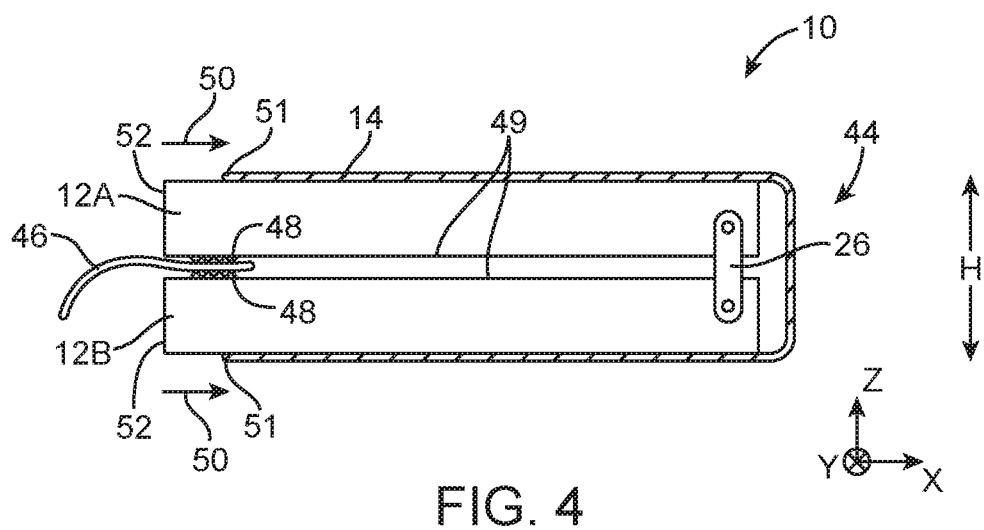
FIG. 4 is a side view of an illustrative electronic device with a flexible display and a hinge formed using a three-bar linkage arrangement in which the flexible display has been placed in a back-to-back configuration in accordance with an embodiment of the present invention.

When portions 12A and 12B are rotated in directions 42 of FIG. 2, housing portions 12A and 12B may be placed in a back-to-back configuration of the type shown in FIG. 4. In this type of configuration, part of display 14 may be exposed on the outer surface of housing structure 12A and part of display 14 may be exposed on the outer surface of housing structures 12B (i.e., the display surface on housing portion 12A is oriented back to back with respect to the display surface on housing portion 12B).

Engagement features such as engagement features 48 may be provided on some or all of rear surfaces 49 of housing structures 12A and 12B to allow device 10 to grip external objects such as external object 46. External object 46 may be, for example, an item of the user's clothing. Engagement features 48 may be roughened surface structures such as teeth. The teeth may be formed as an integral portion of the housing or may be attached to the exterior of the housing. The teeth may be formed from plastic, metal, or other suitable materials. Features 48 may have a sawtooth profile, a smooth undulating corrugated profile, may be implemented using one or more spikes or hooks, or may be formed using other suitable structures that protrude from the surface of housing 12.

Figure 3:
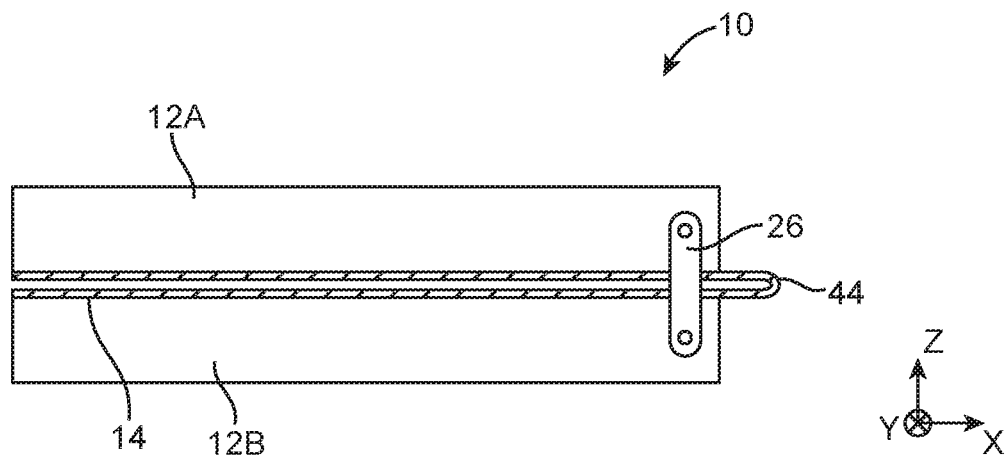
FIG. 3 is a side view of an illustrative electronic device with a flexible display and a hinge formed using a three-bar linkage arrangement in which the flexible display has been placed in a face-to-face configuration in accordance with an embodiment of the present invention.

When housing portions 12A and 12B are rotated from a position of the type shown in FIG. 3 into a position of the type shown in FIG. 4, ends 51 of flexible display 14 may be pulled in directions 50. The length of the display (i.e., the distance along the longer lateral dimension of the display between opposing ends 51) does not change substantially as the display is flexed. In the housing configuration shown in FIG. 3, display 14 runs along the opposing inner surfaces of the housing. In the vicinity of bend 44, display 14 covers minimal distance along dimension Z. As a result, the amount of housing surface over which the display extends is minimized. If, however, device 10 is placed into the position shown in FIG. 4, bent portion 44 of display will cover a height H along dimension Z. During the process of moving device 10 from the configuration of FIG. 3 into the configuration of FIG. 4, one or both ends 51 of display 41 may be permitted to slide along dimension X in direction 50 to accommodate the extra height H.

Any suitable mechanism may be used to allow display 14 to slide along the surface of housing 12 to accommodate changes in the configuration of housing 12. For example, one end of display 14 may be tensioned using a tensioning member, while the opposing end of display 14 is attached to housing 12 using a rigid attachment mechanism (as an example). As the device is placed into different configurations, the tensioning member may stretch and thereby allow at least a portion of the flexible display to slide relative to the surface of the device.

Figure 5:
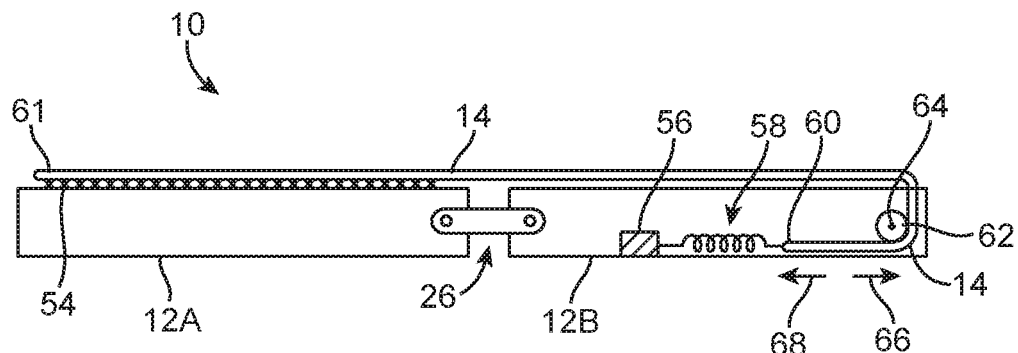
FIG. 5 is a side view of an illustrative electronic device having a tensioning structure and a roller for controlling the dispensing and retracting of a flexible display in accordance with an embodiment of the present invention.

In this type of arrangement, one end of display 14 may be tensioned with a tensioning member or both ends of display 14 may be tensioned with respective tensioning members. The tensioning members may be formed from metal or polymer springs, springs formed from planar elastomeric members that stretch, or other materials that can be placed under tension to tension display 14. An arrangement in which device 10 has been tensioned with a tensioning structure is shown in FIG. 5. As shown in FIG. 5, one end of flexible display 14 (i.e., end 61 and the structures adjacent to end 61 may be attached to the device 12 in a non-sliding (fixed) arrangement). Screws, adhesive, or other fastening mechanisms may be used in attaching display 14 to housing 12.

In the example of FIG. 5, end 61 of display 14 has been attached to the planar exposed surface of display 12A using adhesive 54. Adhesive 54 may be, for example, epoxy, pressure sensitive adhesive, or other suitable adhesive. Tensioning member 58 has been attached between end 60 of display 14 and support structure 56. Support structures 56 may be formed from part of housing 12 (e.g., an integral portion of housing portion 12B), an internal frame structure or other housing structure, or other suitable portion of device 10. When tensioned between member 56 and end 60 of display 14, tensioning member 58 may pull end 60 of flexible display 14 in direction 68. Roller 62 may be mounted on rotational axis member 64. Roller 62 may rotate about rotational axis 64 to allow display 14 to slide relative to housing 12 with minimal friction. A non-rotating member may be used in place of roller 62, if desired.

Flexible display 14 may slide within housing 12B in directions 66 and 68 when needed to accommodate motion of housings 12A and 12B, as described in connection with FIGS. 3 and 4. For example, when housing 12 is folded so that display 14 is enclosed within housing portions 12A and 12B as shown in FIG. 3, slack may tend to develop in display 14. Accordingly, tensioning member 58 may pull end 60 of display 14 in FIG. 5 in direction 68. If, on the other hand, housing 12 is placed into a configuration of the type shown in FIG. 4, tensioning member 58 may stretch to allow end 60 of display 14 move in direction 66.

In the illustrative configuration shown in FIG. 5, roller 62 was used to facilitate the deployment and retraction of end 60 of flexible display 14. If desired, additional rollers and/or other structures for facilitating the dispensing and retraction of flexible display 14 may be used. For example, a fixed member that has been coated with a low-friction coating may be used to dispense and retract flexible display 14, multiple rollers may be used to dispense and retract flexible display 14, etc.

Figure 6:
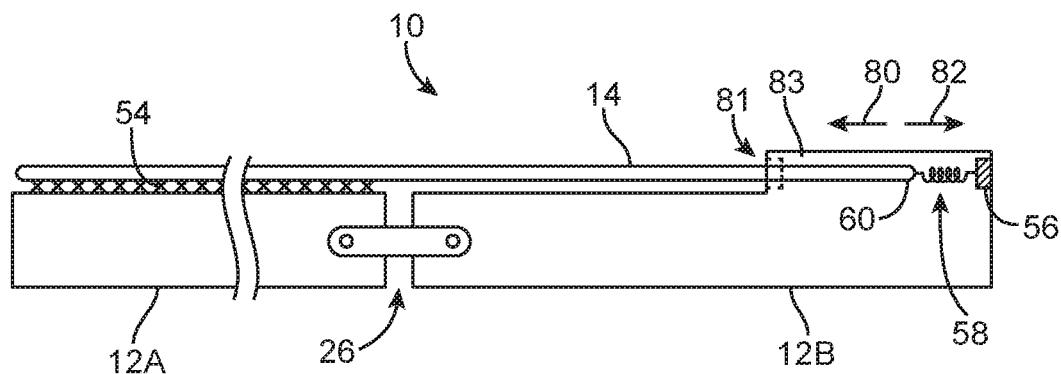
FIG. 6 is a side view of an illustrative electronic device having a tensioning structure and a housing structure protrusion with an opening to accommodate deployment and retraction of a tensioned flexible display in accordance with an embodiment of the present invention.

FIG. 6 is a side view of an illustrative configuration that may be used for device 10 in which end 60 of display 14 is housed within protruding portion 83 of housing 12B and is dispensed without using roller 62. Protruding housing portion 83 may have an opening such as opening 81 that allows display 14 to enter and exit housing portion 83. When housing portions 12A and 12B are folded together to place device 10 in a configuration of the type shown in FIG. 3 (in which the display-covered surfaces of device 10 face each other to protect display 14), tensioning member 58 may retract end 60 of display 14 into device housing 83 in direction 82 to avoid creating slack in display 14. When housing portions 12A and 12B are rotated away from each other to place device 10 into a configuration of the type shown in FIG. 4 (in which the display-covered surfaces of device 10 are facing away from each other), spring 58 may stretch and allow an appropriate portion of display 14 in the vicinity of end 60 to exit opening 81 in protrusion 83 in direction 80, thereby accommodating the need for additional display length.

Figure 7:
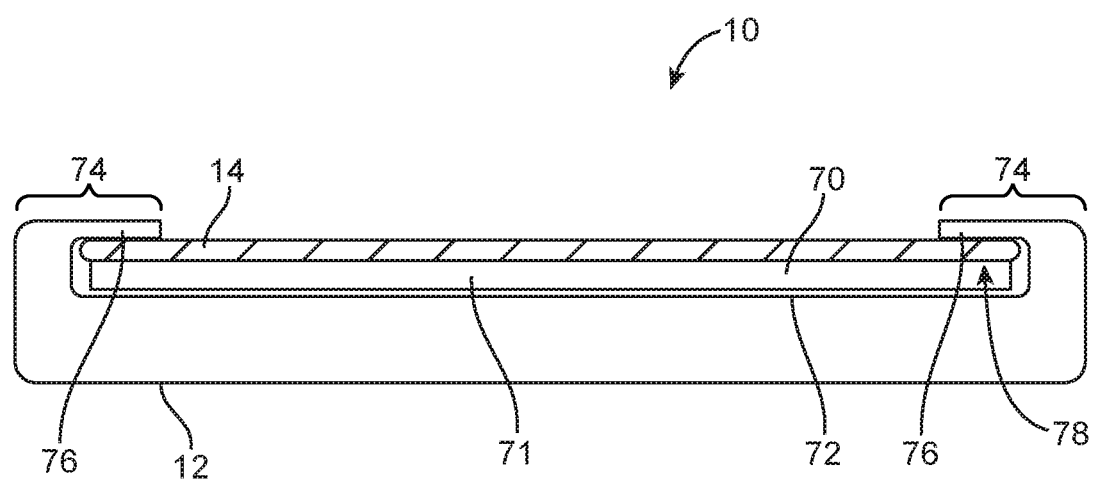
FIG. 7 is a cross-sectional side view of an illustrative electronic device in which a housing has been provided with overhanging portions along its edges that serve to hold a flexible display in place on the planar surface of the housing while the flexible display slides along the surface of the display during deployment and retraction operations in accordance with an embodiment of the present invention.

The edge of display 14 may be covered with housing features such as ledges or other overlapping display retention structures to help hold display 14 on the surface of device 10. As shown in FIG. 7, housing 12 may, for example, have portions 76 that overlap the edges of display 14 to help hold display 14 flat against the planar surface of housing 12. Portions 76 may overlap the edges of display 14 in overlap regions 74. The width of overlap regions 74 may be, for example, more than 4 mm, 4 mm or less, 3 mm or less, 2 mm or less, 1 mm or less, or 0.5 mm or less.

To accommodate sliding motion of display 14 (e.g., into and out of the page in the orientation of FIG. 7), a layer of low-friction material 70 may be placed between display 14 and the outermost surface of housing 12. For example, housing 12 may have a planar surface such as planar surface 71 that may be formed form a layer of plastic or metal. To reduce the friction that display 14 might otherwise exhibit, low-friction material 70 may be interposed between surface 71 and display 14. Material 70 may be formed from one or more coating layers on housing 12, a layer of low-friction polymer such as a sheet of polytetrafluoroethylene, etc.

Figure 8:
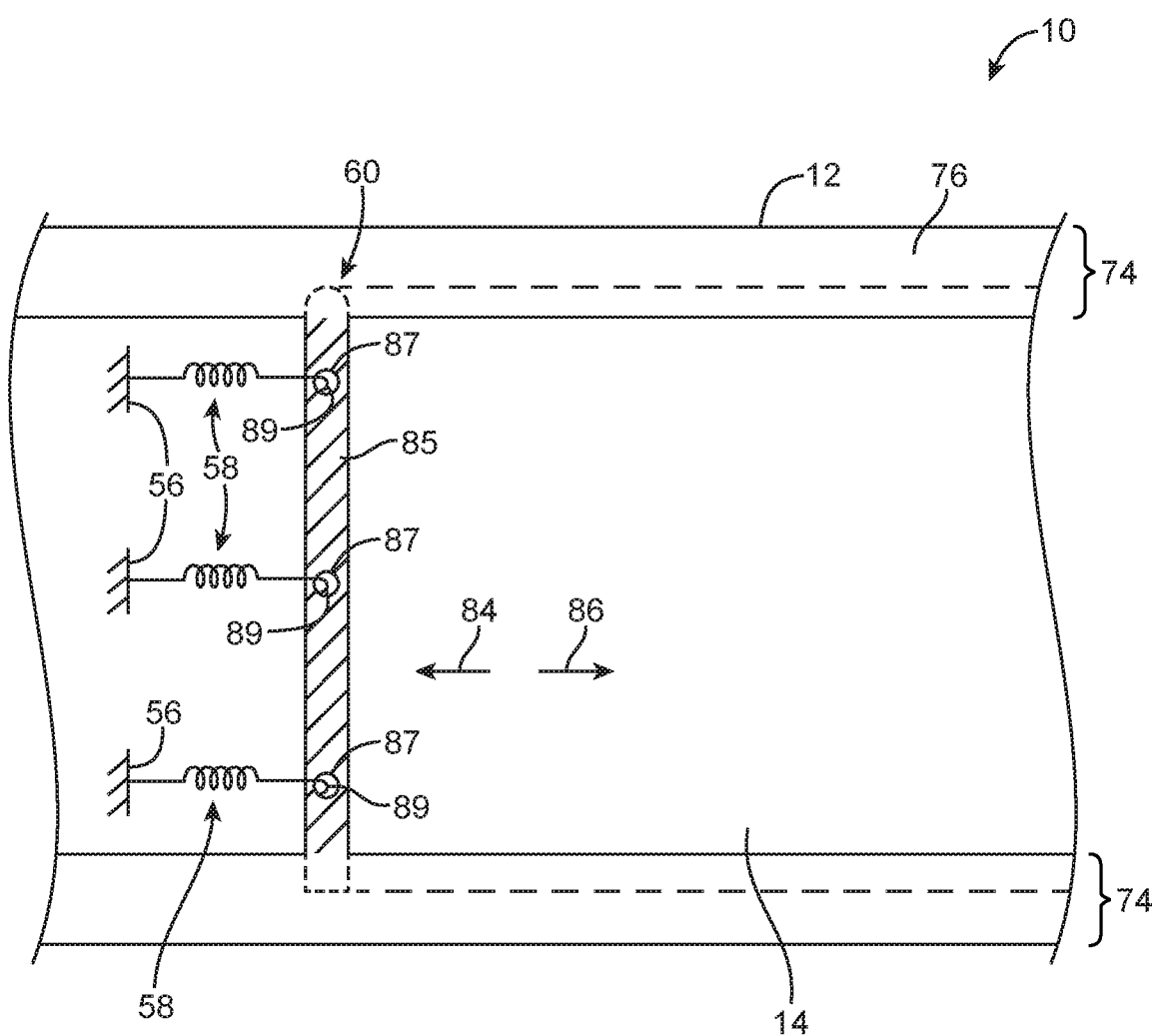
FIG. 8 is a top view of an electronic device having a housing with overlapping edge portions that guide and hold a flexible display as the flexible display slides relative to the housing in accordance with an embodiment of the present invention.

FIG. 8 is a top view of a portion of device 10 showing how display 14 may slide on the surface of housing 12 while side edge portions of display 14 are retained using retention features 76 in regions 74. To facilitate even tensioning of leading edge 60 of display 14 by tensioning structures 58, a display edge stiffening member such as edge stiffening member 85 of FIG. 8 may be attached to edge 60 of display 14. Edge stiffening member 85 may be formed from plastic, metal, or other suitable materials. Openings 87 may be formed in edge stiffening member 85 to receive hooked features 89 on tensioning structures 58. If desired, engagement features on edge stiffening member 85 and/or tensioning structures 85 may be formed using other configurations. The arrangement of FIG. 8 in which edge stiffening member 85 has holes and tensioning structures 85 (e.g., springs) have mating hook-shaped features is merely illustrative.

In the example of FIG. 8, edge stiffening member 85 is being tensioned using three tensioning structures 58 (e.g., three springs). Other numbers of tensioning structures 58 may be used if desired. For example, one spring or other tensioning structure may be used to tension edge stiffening member 85, two or more springs or other tensioning structures may be used to tension edge stiffening member 85, three or more springs or other tensioning structures may be used to tension edge stiffening member 85, etc.

Figure 9:
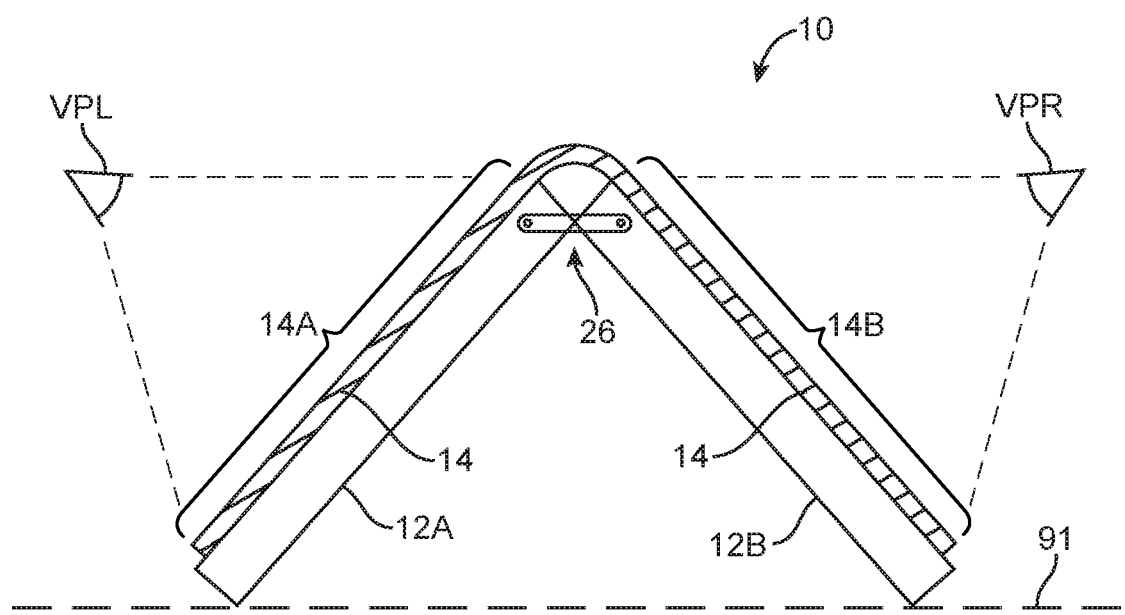
FIG. 9 is a side view of an illustrative electronic device with a flexible display that has first and second housing portions that have been rotated relative to each other to place the electronic device housing into a triangular configuration in accordance with an embodiment of the present invention.

Housing portions 12A and 12B may be used to place device 10 in an arrangement of the type shown in FIG. 9 in which display 14 has a non-planar shape other than the back-to-back configuration of FIG. 4. In an arrangement of the type shown in FIG. 9, one portion of display 14 (i.e., display portion 14A mounted on the surface of housing portion 12A) may be viewed by a user on one side of device 10 (i.e., from position VPL), whereas another portion of display 14 (i.e., display portion 14B mounted on the surface of housing 12B) may be viewed by a user on the other side of device (i.e., from position VPR). The triangular shape of device 10 in this type of configuration may allow device 10 to rest on top of a table or other flat surface, as illustrated by horizontal line 91. This configuration may be used, for example, to allow multiple users to use device 10 simultaneously (e.g., to play a two-person game, to use two separate applications, one of which is displayed on portion 14A and another of which is displayed on portion 14B, etc.).

Figure 10:
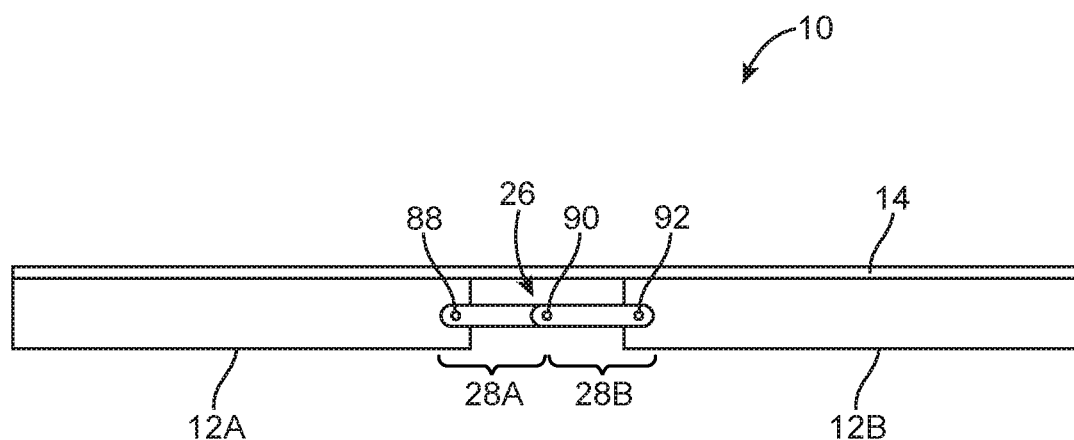
FIG. 10 is a side view of an illustrative electronic device with a flexible display having a hinge that is based on a four-bar linkage in accordance with an embodiment of the present invention.

In arrangements such as the arrangement of FIG. 9, hinge 26 of device 10 has been illustrated as being implemented using a three-bar linkage. This is merely illustrative. Hinge 26 may use any suitable type of flexible joint. FIG. 10 is a side view of an illustrative device showing how hinge 26 may be formed using a four-bar linkage having first shaft (rotational axis) 88, second shaft (rotational axis 90), and third shaft (rotational axis) 92. Hinge 26 may include first hinge member 28A and second hinge member 28B. There may be identical hinge structures at both ends of the hinge axis of display 14. Only one set of hinge structures (e.g., the right-hand set) is visible in the example of FIG. 10.

Hinge member 28A may be coupled to housing 12A at shaft 88. Hinge member 28B may be coupled to housing 12B at shaft 92. Shaft 90 may be used to link hinge member 28A and hinge member 28B.

Figure 11:
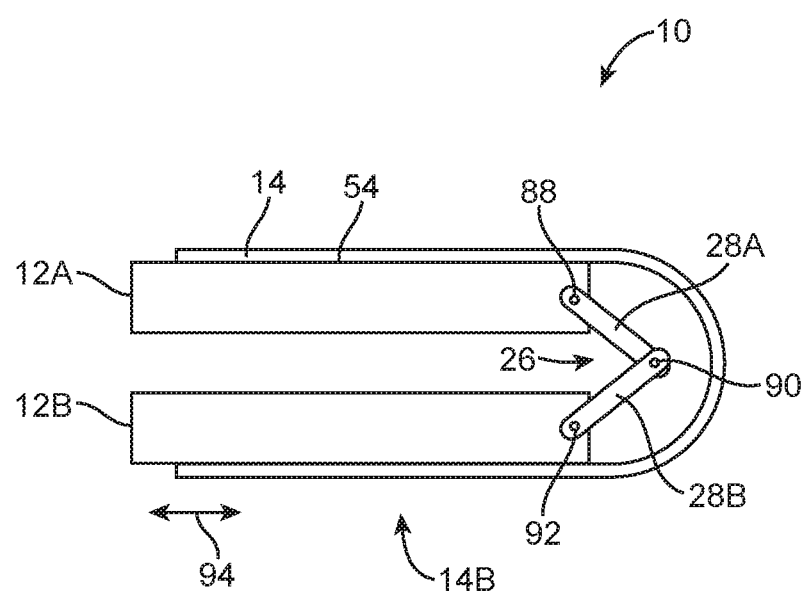
FIG. 11 is a side view of an illustrative electronic device of the type shown in FIG. 10 that has a flexible display and a hinge that is based on a four-bar linkage in which the device housing has been manipulated to place the display in a back-to-back configuration in accordance with an embodiment of the present invention.

When rotating housings 12A and 12B with respect to each other, the use of the four-bar linkage design for hinge 26 may provide desirable degrees of freedom. The four-bar linkage design may, as an example, be able to accommodate a range of relative positions for housing members 12A and 12B without requiring the same amount of sliding motion for display 14 relative to housing 12 that might otherwise be involved in bending display 14 (e.g., when bending display 14 using a hinge based on a three-bar linkage). In particular, sliding motions 94 along the surface of housing portion 12B of FIG. 11 may be minimized by the use of the four-bar linkage for hinge 26. If desired, portion 14B may be attached to housing 12B using a fixed (non-sliding) arrangement such as an arrangement based on adhesive (e.g., adhesive such as adhesive 54).

Figure 12:
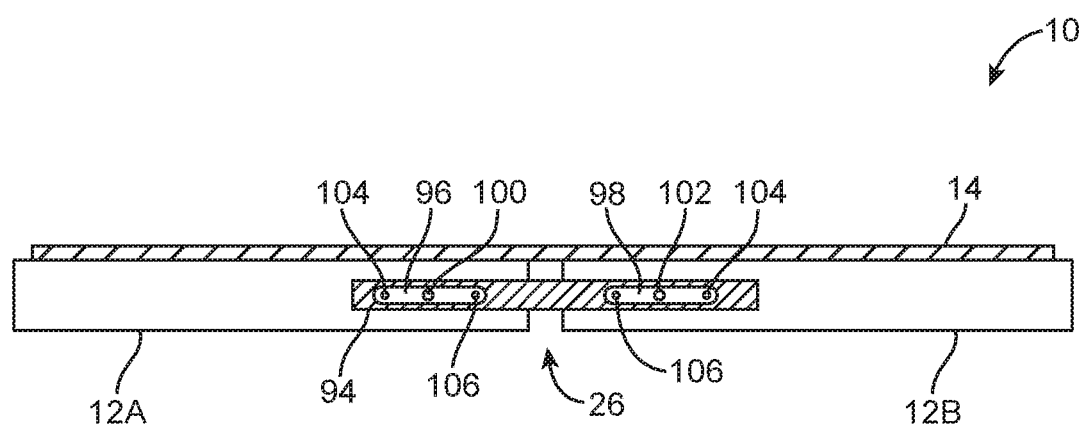
FIG. 12 is a side view of an illustrative electronic device having a flexible display mounted on two housing portions that are coupled using a hinge with first and second slots that receive sliding shafts attached to the housing portions in accordance with an embodiment of the present invention.

The side view of device 10 of FIG. 12 shows how hinge 26 may be implemented using a slotted member such as hinge member 94. As shown in FIG. 12, hinge member 94 may have slots such as slot 96 and slot 98. Pin (shaft structure 100) may be received within slot 96 (or other opening in member 94). Pin (shaft structure 102) may be received within slot 98 (or other opening in member 94). The use of openings in member 94 such as slots 96 and 98 may provide additional degrees of freedom when positioning housing structures 12A and 12B relative to each other. For example, slots 96 and 98 may allow housings 12A and 12B to be placed in either the face-to-face configuration of FIG. 3 or the back-to-back configuration of FIG. 4. In a face-to-face configuration of the type shown in FIG. 3, shaft 100 may be located in position 106 of slot 96 and shaft 102 may slide to position 106 of slot 98. In a back-to-back configuration of the type shown in FIG. 4, shaft 100 may be located in position 104 of slot 98 and shaft 102 may be located in position 104 of slot 98. There may be identical hinges on both sides of device 10. A single set of hinge structures for a single hinge 26 is shown in the example of FIG. 12. In configurations with suitable hinge structures such as hinges with slotted hinge members such as hinge member 94 of FIG. 12, flexible display 14 may be fixedly attached to the surfaces of housing members 12A and 12B. This is because the hinge structures are sufficiently flexible to accommodate the fixed length of display 14. The use of flexible display arrangements where the flexible display slides relative to the surface of housing 12 may therefore not be needed.

Figure 13:
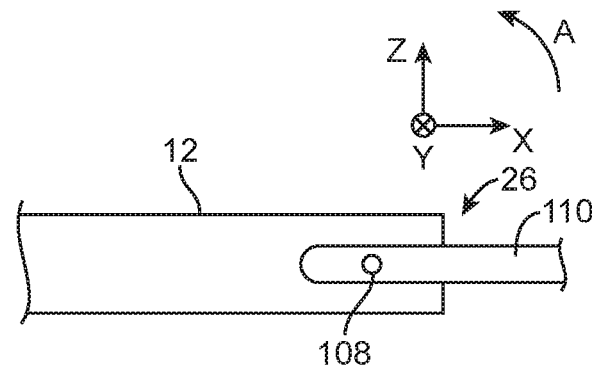
FIG. 13 is a side view of a portion of an illustrative electronic device with a hinge that may be provided with rotational detents in accordance with an embodiment of the present invention.

In devices 10 in which display structures such as two or more housing portions such as housings 12A and 12B can be placed in a variety of different positions relative to each other, it may be desirable to provide hinges 26 with detents. Detent structures may, for example, be formed using spring-loaded structure. FIG. 13 is a side view of an illustrative hinge 26 of the type that may be provided with a rotational detent. As shown in FIG. 13, device 10 may have a housing such as housing 12. Hinge member 110 may be used in forming hinge 26. In the FIG. 13 example, hinge member 110 rotates around shaft (rotational axis) 108 so that hinge member 110 (and any structures attached to member 110) may be placed at a variety of rotational angles A with respect to housing 12.

Figure 14:
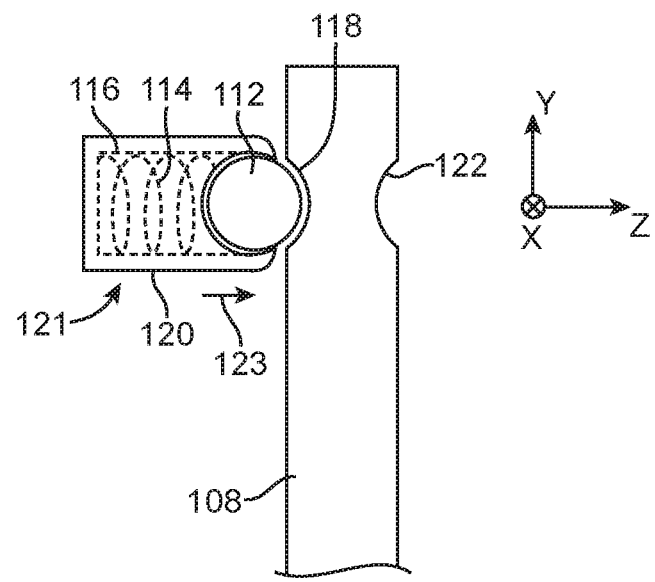
FIG. 14 is a top view of an illustrative shaft with a recess that receives a ball in a ball detent mechanism in accordance with an embodiment of the present invention.
Figure 15:
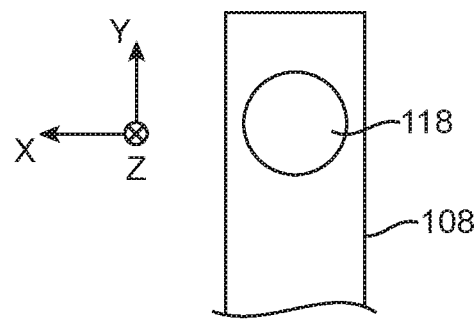
FIG. 15 is a side view of the illustrative shaft of FIG. 14 showing how the shaft may be provided with a circular recess to receive the ball of the ball detent mechanism in accordance with an embodiment of the present invention.

To provide rotational detents for hinge 26, shaft 108 may be provided with indentations such as indentations 118 and 122 of FIG. 14. A mating detent biasing structure such as biasing structure 121 may be used to engage indentations 118 and 122. Biasing structure 121 may have a body portion 120. A cylindrical bore such as bore 116 may be provided in the interior of body structure 120. Ball 112 may be received within bore 116. Spring 114 may be used to bias ball 112 in direction 123 towards shaft 108 to engage shaft 108 and retard rotational motion of shaft 108. In the example of FIG. 14, biasing structure 121 is using ball 112 to engage indentation 118. If member 110 were to be rotated 180°, biasing structure 121 would engage indentation 122 on the opposing side of shaft (pin) 108. FIG. 15 is a side view of shaft 108 showing how indent 118 (and indent 122) may have circular outlines for receiving ball 112 (as an example).

Shaft 108 may be attached to housing 12 and biasing structure 121 may be attached to member 110 or vice versa. During operation, the detent mechanism may hold housing portions 12A and 12B in two positions (one associated with indentation 118 and one associated with indent 122). In general, shafts such as shaft 108 and hinge 26 may have any suitable number of indentations (e.g., one, two, more than two, three, four or more, and/or five or more). Each indentation may be used in providing a rotational detent at a different respectively angular position A.

There may be one rotational detent in hinge 26 (e.g., holding the housings in device 10 at an angle A1 with respect to each other), two rotational detents (e.g., at angles A1 and A2), or more rotational detents. The detents in hinge 26 may be used, for example, to hold device housings 12A and 12B in a position such as the face-to-face position of FIG. 3, a back-to-back position such as the back-to-back position of FIG. 4, a planar position (e.g., a position in which display 14 is held flat in a planar configuration as shown in FIG. 2), an angled (triangular) position of the type shown in FIG. 9 in which display surfaces 14A and 14B are oriented away from each other, a tilted display position of the type shown in FIG. 1, other suitable positions, and/or subsets of these positions. Ball detents or any other suitable detent mechanisms may be used in forming rotational detents for hinge 26. The use of ball detents is merely illustrative.

Figure 16:
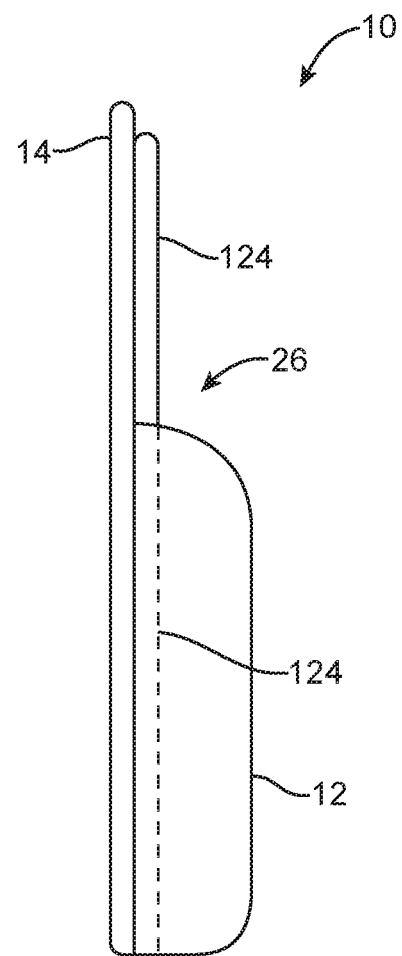
FIG. 16 is a side view of an illustrative electronic device with a flexible display that has a housing that is based on a rigid housing structure and an associated flexible support structure such as a sheet of flexible metal in accordance with an embodiment of the present invention.

As shown in the side view of FIG. 16, device 10 may include a flexible support structure such as support structure 124. Flexible display 14 may be mounted on support structure 124 (e.g., using adhesive, fasteners, or other suitable attachment mechanisms). Support structure 124 may, for example, be formed from a planar layer of material, a skeletal structure (e.g., a frame structure), side support members, or other suitable shapes. Support structure 124 may be formed from a flexible metal, a flexible polymer, a flexible composite structure, other materials, or a combination of these materials. As an example, support structure 124 may be formed form a flexible sheet metal structure such as a layer of nitinol (nickel titanium).

Structure 124 may have a thickness of about 1 mm or less, 0.5 mm or less, 0.2 mm or less, etc. Openings may be provided in structure 124 to reduce weight and/or to increase flexibility. The openings may be, for example, an array of holes. If desired, electrical current may be applied to structure 124 to ohmically heat structure 124. In configurations where structure 124 is formed from a shape memory alloy such as NiTi (nitinol), CuZnAl, or CuAlNi, the application of heat to structure 124 may be helpful in restoring a desired shape to structure 124 (e.g., a planar shape). Electrical current for restoring support structure 124 to a desired shape after flexing may be applied to structure 124 using internal device components such as a battery and control circuit (as an example).

Flexible support structure 124 may be attached to main housing 12 by molding parts of a plastic housing structure for housing 12 over support structures 124, by welding support structures 124 to housing structures, by mounting support structure 124 to housing 12 using screws or other fasteners, or by using other mounting techniques.

Figure 17:
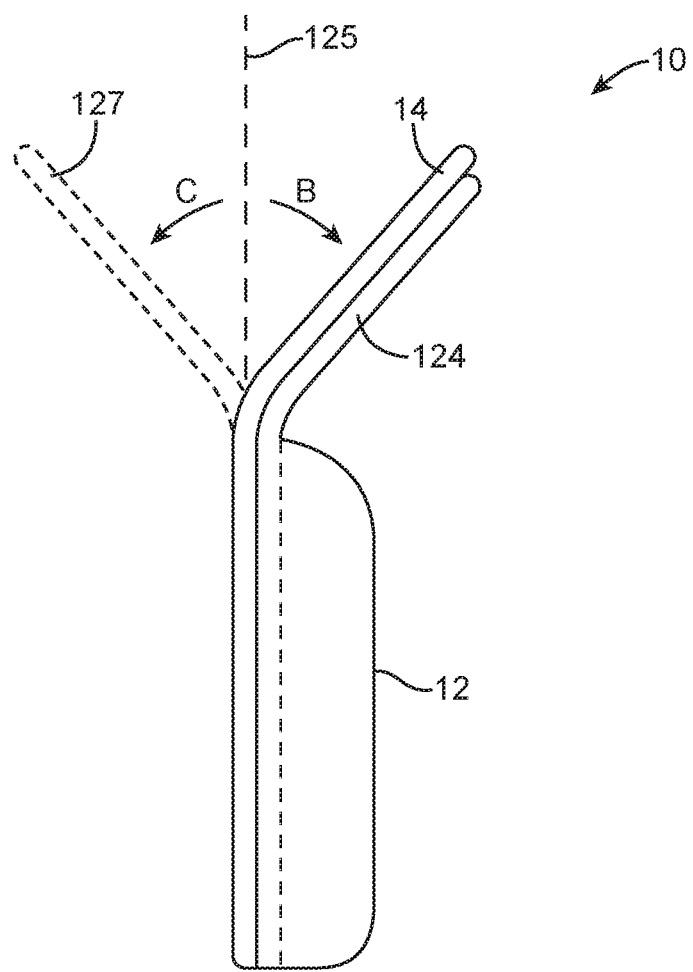
FIG. 17 is a side view of an illustrative electronic device of the type shown in FIG. 16 in which the flexible support structure and the flexible display have been bent backward to tilt a portion of the flexible display away from its planar position in accordance with an embodiment of the present invention.

As shown in FIG. 17, a user of device 10 may bend flexible support structure 124 to place flexible display 14 in a desired bent configuration. The illustrative bent configuration of FIG. 17 involves a backwards tilt of display 14 at an angle B away from planar (flat) display position 125. Angle B may be, for example, 0° to 180°. If desired, a user may tilt display 14 to a position such as position 127. In position 127, display 14 is tilted forward from planar display position 125 by an angle C. Angle C may be, for example, an angle in the range of 0° to 180°.

Figure 18:
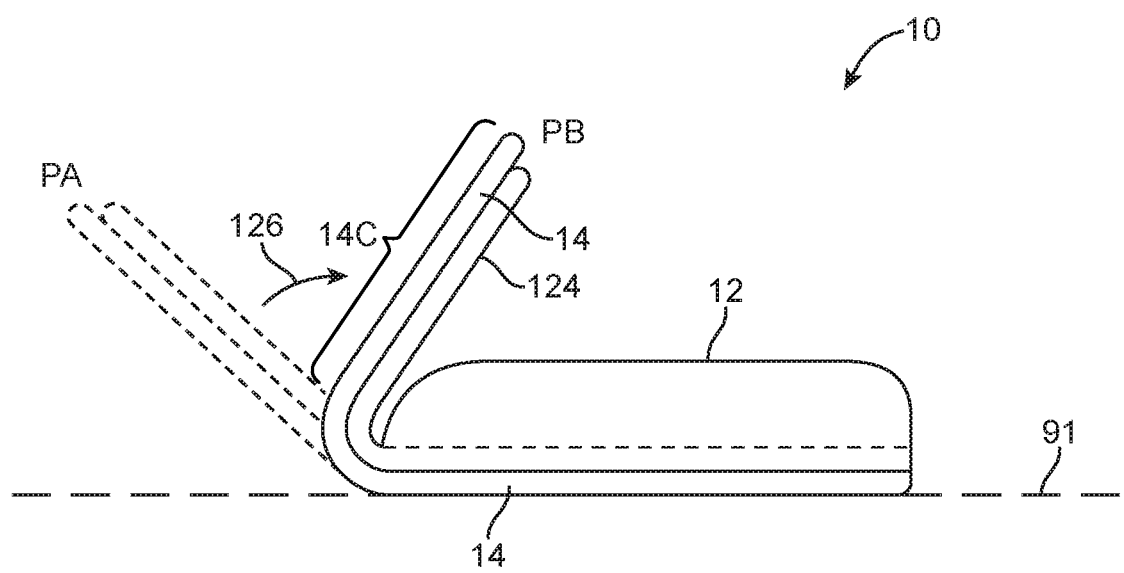
FIG. 18 is a side view of an electronic device of the type shown in FIG. 16 in which the flexible display has been bent backwards sufficiently to create a viewable display portion while a portion of the display rests on a flat surface in accordance with an embodiment of the present invention.

As shown in the example of FIG. 18, flexible display 14 and flexible support structure 124 may be bent in direction 126 to move display 14 and structure 124 from position PA to position PB. When flexible display and support structure 124 are in a position such as position PB of FIG. 18, device 10 may be placed on a surface such as surface 91, so that portion 14C of display 14 may be viewed by a user. If desired, the portion of display 14 that rests against surface 91 may be protected by a layer of cover glass and/or by providing housing 12 with raised peripheral ridge portions that prevent scratching of display 14.

Figure 19:
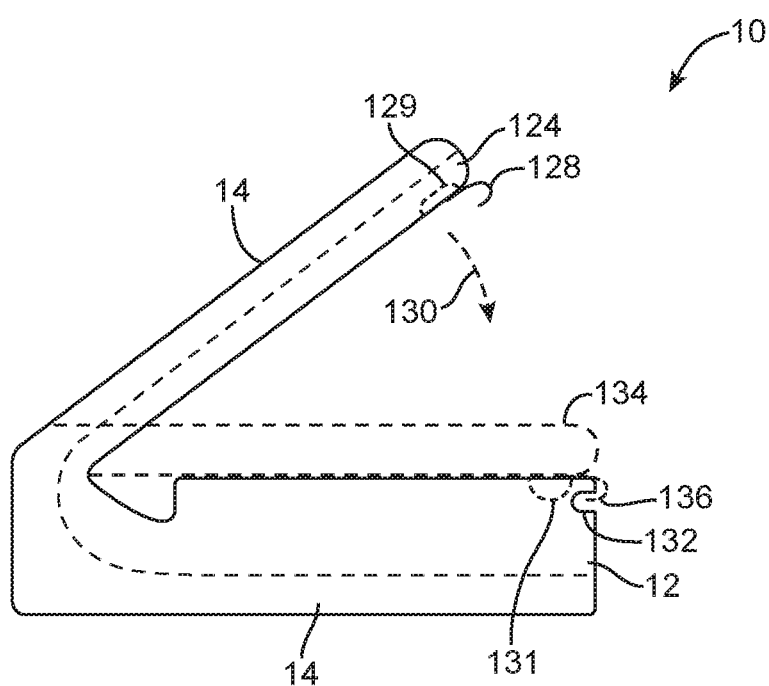
FIG. 19 is a cross-sectional side view of an illustrative electronic device having a flexible display mounted to a flexible support structure showing how the device may be provided with engagement features such as a hook and mating notch to help hold the flexible display in a back-to-back configuration in accordance with the present invention.

As shown in FIG. 19, device 10 may be provided with engagement features such as hook 128 and notch 132. Hook 128 may be attached to support structure 124 or other portion of the housing structures that support display 14. Notch 132 may be configured to receive hook 128 when display 14 is bent downwards in direction 130. As shown by dashed line 136, hook 128 may mate with notch 132 when display 14 has been placed in position 134. This type of configuration or other suitable engagement feature arrangement may be used in holding display 14 into a back-to-back position (i.e., a configuration in which the folded portion of display 14 is in position 134 of FIG. 19 and is facing upwards while the unfolded portion of display 14 is facing downwards). The use of engagement features based on a hook-and-notch arrangement is merely illustrative. Other types of engagement features (e.g., engagement features 129 and 131 in the example of FIG. 19) may be used if desired (e.g., magnetic structures, snaps, hook-and-loop fastener material, other interlocking shapes, etc.).

Figure 20:
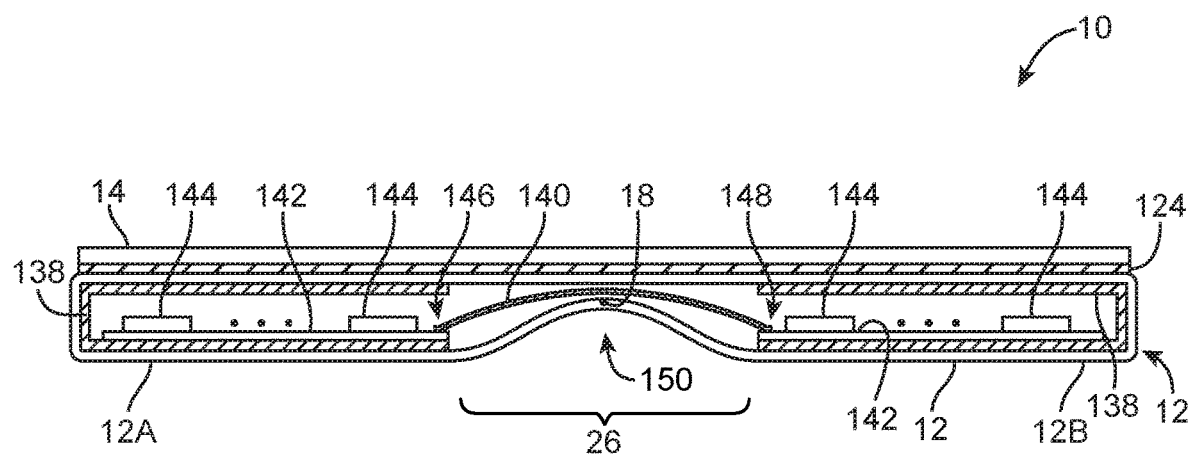
FIG. 20 is a side view of an illustrative electronic device with a flexible display in which the electronic device housing has been formed from a flexible material that forms a hinge and in which rigid structures form enclosures for internal device components in accordance with an embodiment of the present invention.

As shown in FIG. 20, device 10 may have a hinge that is formed from a flexible portion of housing 12. In the configuration of device 10 that is shown in FIG. 12, housing 12 has first portion 12A and second portion 12B that are interconnected using hinge 26. Components 144 may be mounted in housing 12. For example, components 144 may be mounted in the interior of housing portion 12A and/or in the interior of housing portion 12B. Components 144 may be mounted on substrates such as rigid printed circuits boards, flexible printed circuit boards, plastic carriers, or other substrates (shown as substrates 142 in FIG. 20). Interconnection paths formed from flex circuit cables, wires, interconnect traces on printed circuit boards and other substrates, and other interconnect paths may be used in interconnecting components 144 and flexible display 14. For example, flexible communications path 140 may be coupled between substrate 142 in housing portion 12A and substrate 142 in housing portion 12B. Path 140 may be connected to traces on the substrate in housing portion 12A at connection point 146 and may be connected to traces on the substrate in housing portion 12B at connection point 148. The traces on the substrates may be used to interconnect components 144 with each other and to path 140. Components 144 may include components such as connectors, integrated circuits (e.g., display driver circuitry for controlling display 14), discrete components such as inductors, resistors, and capacitors, sensors, status indicator lights, cameras, microphones, speakers, antennas, batteries, etc.

To facilitate bending of display 14 and housing 12 in the vicinity of hinge 26, housing 12 may, as an example, be formed from a flexible material. Examples of flexible materials that may be used in forming housing 12 include flexible polymers, composite structures (e.g., fiber-based composites, fiber-impregnated polymers, etc.), fabrics, and flexible metals. When housing portions 12A and 12B are rotated relative to each other around hinge axis 18, housing 12 may flex.

Inflexible structures such as structures 138 may be used to locally strengthen the walls of housing 12 in regions of housing 12 away from hinge 26. For example, housing 12 may be provided with rigid support structures such as support structures 138. Structures 138 may be formed from glass, ceramic, metal, fiber-composites, other suitable materials, combinations of these materials, or other suitable materials. Structures 138 may be configured to form rigid box-shaped shells or shells of other shapes that partly or completely surround and protect internal components 144 in housing portions 12A and 12B from damage when the flexible material of housing 12 is being used as a hinge and is being flexed (with flexible display 14) about axis 18. When device 10 is flexed around axis 18, the flexible portions of housing 12 that form hinge 26 may flex. Recessed region 150 may be provided in housing 12 to facilitate flexing of housing 12. As device 10 is flexed, flexible communications path 140 may flex, while maintaining an electrical pathway for signals passing between housing portions 12A and 12B.

Figure 21:
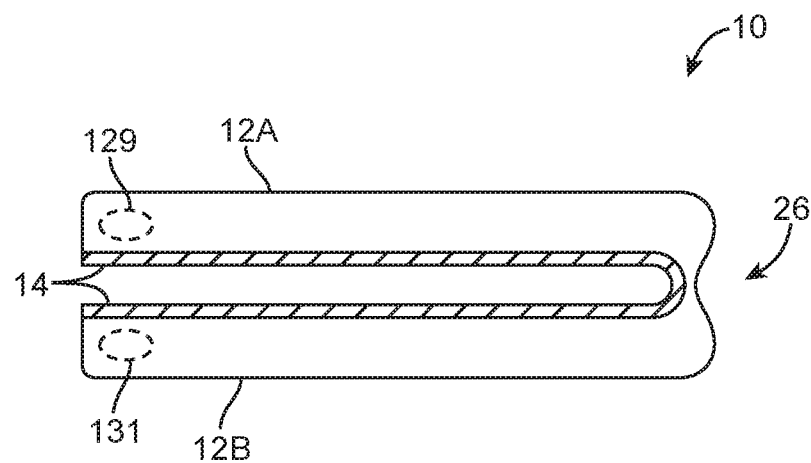
FIG. 21 is a side view of an illustrative electronic device with a flexible display that has a hinge formed from a flexible housing material in which the flexible display has been placed in a face-to-face configuration in accordance with an embodiment of the present invention.
Figure 22:
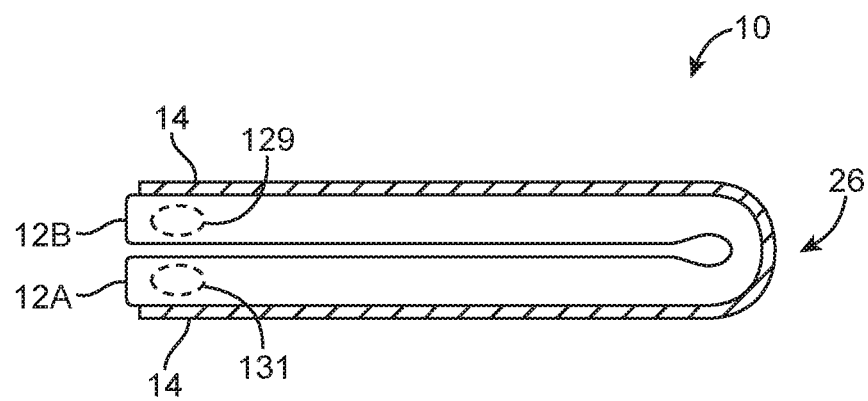
FIG. 22 is a side view of an illustrative electronic device with a flexible display that has a hinge formed from a flexible housing material in which the flexible display has been placed in a back-to-back configuration in accordance with an embodiment of the present invention.

FIG. 21 shows how a device having a hinge formed from a flexible portion of housing 12 such as device 10 of FIG. 20 may appear when housing portions 12A and 12B have been manipulated to flex hinge 26 and place flexible display 14 in a face-to-face configuration. FIG. 22 shows how device 10 of FIG. 20 may appear when housing portions 12A and 12B have been manipulated to place flexible display 14 in a back-to-back configuration. In configurations of the type shown in FIGS. 21 and 22, engagement features 129 and 131 (e.g., magnetic structures, hook-and-loop fasteners, hook and notch structures, other mating structures, or other suitable engagement features) may be used in holding housing portions 12A and 12B in desired positions.

Figure 23:
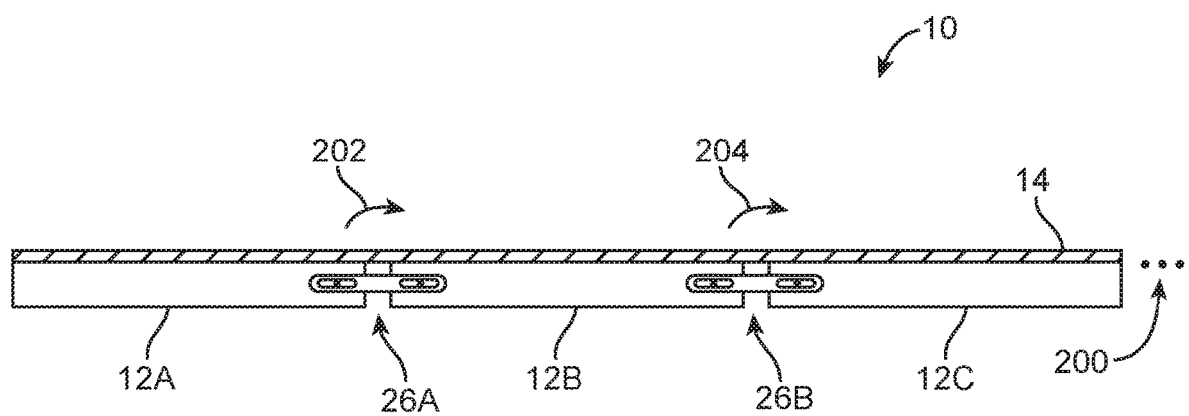
FIG. 23 is a side view of an illustrative electronic device with at least three separate housing portions connected by at least two hinges and covered with a flexible display in accordance with an embodiment of the present invention.

FIG. 23 is a side view of an illustrative electronic device with three separate housing portions 12A, 12B, and 12C. As shown in FIG. 23, housing portions 12A and 12B in device 10 may be coupled using hinge 26A and housing portions 12B and 12C may be coupled using hinge 26B. Additional housing portions may be provided in device 10 if desired, as indicated by dots 200. Hinges 26 may be formed form flexible housing portions, from three-bar or four-bar linkages, from members containing slots (as shown in FIG. 23), from flexible metal layers or other sheets of flexible support structure material, from other hinge structures, or from combinations of such structures.

Figure 24:
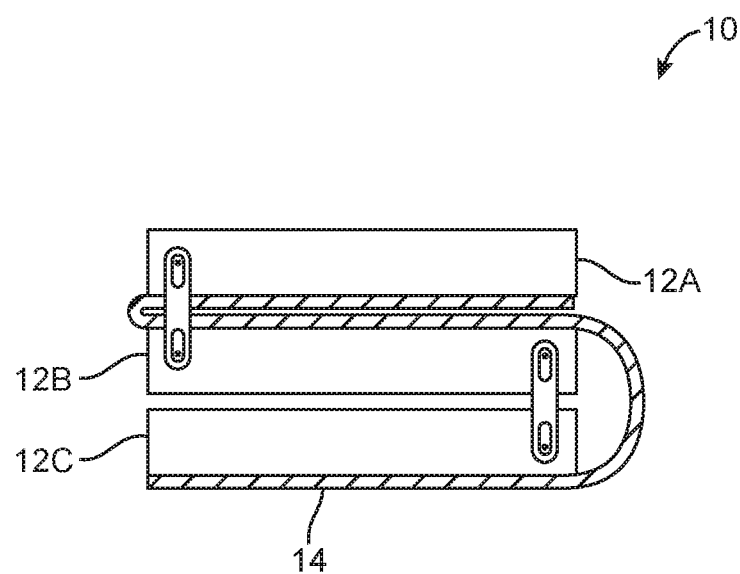
FIG. 24 is a side view of an illustrative electronic device with at least three separate housing portions connected by at least two hinges and covered with a flexible display in which the portions of the device housing have been positioned to place the device in a folded configuration in accordance with an embodiment of the present invention.

When it is desired to place a device such as device 10 into a folded configuration, housing portion 12A may be rotated relative to housing portion 12B in direction 202 and housing portion 12C may be rotated in direction 204 relative to housing portion 12B (as an example). Following folding in this way, electronic device 10 may have a configuration of the type shown in FIG. 24. In this type of configuration, the portions of flexible display 14 that are associated with housing portions 12A and 12B may have a face-to-face configuration, whereas the portions of flexible display 14 that are associated with housing portions 12B and 12C may have a back-to-back configuration. If desired, hinges 26A and 26B may be configured so that housing portions 12A and 12C can both fold inwardly onto housing portion 12B. The arrangement shown in FIG. 24 is merely illustrative.

Device 10 may, in general, have any suitable hinge structure (a three-bar linkage, a four-bar linkage, a flexible housing hinge, hinge structures with rotational detents, hinges based on slotted members, etc.), any suitable housing structure (e.g., metal, plastic, rigid, flexible, composite, etc.), any suitable number of housing portions (two, three, four, two or more, three or more, four or more), any suitable type of flexible display attachment mechanism (fixed, sliding, fixed at one end, sliding at another), any suitable number of detents, any suitable type of tensioning structures (e.g., springs, etc.), any suitable type of flexible display dispensing and retracting structures (roller-based, housing-protrusion-based, etc.), any suitable type of housing structure engagement features (magnetic structures, hook-and-loop fastening material, hooks and recesses, etc.), any suitable type of external object engagement features (e.g., raised housing ridges for gripping cloth), other suitable features, combinations of any or all of these features, etc.

The foregoing is merely illustrative of the principles of this invention and various modifications can be made by those skilled in the art without departing from the scope and spirit of the invention.

What is claimed is:

1. An electronic device, comprising:
    a housing having first and second housing portions that rotate relative to one another about an axis;
    a display that overlaps the first and second housing portions and that folds along the axis, wherein the display has first and second display portions that face each other in a first folded configuration and that face in opposite directions in a second folded configuration;
    electrical components in the first and second housing portions;
    a flexible signal path that extends across the axis and that couples the electrical components in the first housing portion to the electrical components in the second housing portion; and
    magnetic structures configured to hold the housing in a given position.

2. The electronic device defined in claim 1 wherein the flexible signal path comprises a flexible printed circuit.

3. The electronic device defined in claim 1 wherein the housing comprises a hinge formed from a flexible material.

4. The electronic device defined in claim 3 wherein the flexible material comprises a flexible polymer.

5. The electronic device defined in claim 1 wherein the first and second display portions lie in a common plane when the display is unfolded.

6. The electronic device defined in claim 1 wherein the electrical components comprise at least one electrical component selected from the group consisting of: a camera, a display driver integrated circuit, a sensor, and a battery.

7. The electronic device defined in claim 1 wherein the display comprises an organic light-emitting diode display configured to display images across the axis.

8. The electronic device defined in claim 1 further comprising stiffening structures in the first and second housing portions that are separated by a gap, wherein the gap overlaps the axis.

9. An electronic device, comprising:
    a housing having first and second housing portions joined by a hinge, wherein the first and second housing portions comprise a rigid material and the hinge comprises a flexible material;
    a foldable display overlapping the first and second housing portions and configured to display images across the hinge, wherein the foldable display has first and second display portions that face each other in a first folded configuration and that face in opposite directions in a second folded configuration; and
    electrical components in the first and second housing portions.

10. The electronic device defined in claim 9 wherein the rigid material comprises metal.

11. The electronic device defined in claim 9 further comprising a gap in the rigid material that overlaps the hinge.

12. The electronic device defined in claim 9 wherein the electrical components comprise at least one electrical component selected from the group consisting of: a camera, a display driver integrated circuit, a sensor, and a battery.

13. The electronic device defined in claim 9 further comprising magnetic structures that hold the housing in a given position.

14. An electronic device,
    a foldable housing having a hinge formed from a flexible material;
    a foldable display having first and second portions and configured to display images across the hinge; and
    a recessed portion in the foldable housing that allows the foldable housing to be placed in at least first and second positions, wherein the first and second portions of the foldable display face toward one another when the foldable housing is in the first position and face away from one another when the foldable housing is in the second position.

15. The electronic device defined in claim 14 further comprising electrical components in the foldable housing that are coupled together with a flexible printed circuit that extends across the hinge.

16. The electronic device defined in claim 14 further comprising:
    rigid support structures in the foldable housing; and
    a gap in the rigid support structures that overlaps the hinge.

17. The electronic device defined in claim 16 wherein the rigid support structures comprise metal.

18. The electronic device defined in claim 14 further comprising magnetic structures that hold the foldable housing in the first and second positions.

* * * * *